United States Patent
Ohsaki et al.

(10) Patent No.: US 6,975,385 B2
(45) Date of Patent: Dec. 13, 2005

(54) PROJECTION OPTICAL SYSTEM AND EXPOSURE APPARATUS

(75) Inventors: Yumiko Ohsaki, Tochigi (JP); Toshihiro Sunaga, Tochigi (JP); Koshi Hatakeyama, Tochigi (JP); Takahiro Sasaki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/701,677

(22) Filed: Nov. 4, 2003

(65) Prior Publication Data

US 2004/0095567 A1 May 20, 2004

(30) Foreign Application Priority Data

Nov. 8, 2002 (JP) ........................................ 2002-325353
Feb. 21, 2003 (JP) ........................................ 2003-044890

(51) Int. Cl.$^7$ ............................. G03B 27/54; G02B 5/10
(52) U.S. Cl. ........................................ 355/67; 359/859
(58) Field of Search ........................ 355/53, 55, 67–71; 359/366, 729, 859, 856–858

(56) References Cited

U.S. PATENT DOCUMENTS

| | | | | |
|---|---|---|---|---|
| 5,309,276 A | * | 5/1994 | Rodgers | 359/366 |
| 5,315,629 A | * | 5/1994 | Jewell et al. | 378/34 |
| 5,686,728 A | | 11/1997 | Shafer | |
| 5,956,192 A | * | 9/1999 | Williamson | 359/859 |
| 6,172,825 B1 | * | 1/2001 | Takahashi | 359/859 |
| 6,353,470 B1 | | 3/2002 | Dinger | |
| 6,356,388 B1 | * | 3/2002 | Geyl | 359/366 |
| 6,576,380 B2 | * | 6/2003 | Davis et al. | 430/5 |
| 6,710,917 B2 | * | 3/2004 | Mann et al. | 359/365 |
| 2002/0154395 A1 | | 10/2002 | Mann et al. | |
| 2004/0160666 A1 | * | 8/2004 | Hudyma | 359/359 |

FOREIGN PATENT DOCUMENTS

DE           19923609 A1      12/1999

OTHER PUBLICATIONS

An Office Action issued from the Taiwanese Patent Office on May 4, 2005 for Appl. No. 092,131,116 and An English translation of the Taiwanese Office Action and TIPLO's Remarks.

* cited by examiner

Primary Examiner—Henry Hung Nguyen
(74) Attorney, Agent, or Firm—Morgan & Finnegan, L.L.P.

(57) ABSTRACT

A six-mirror catoptric projection optical system for projecting a reduced size of a pattern on an object onto an image plane includes first, second, third, fourth, fifth, and sixth mirrors from the image plane along an optical path, wherein the third and fourth mirrors are located between the fifth mirror and sixth mirror and wherein the catoptric projection optical system forms an intermediate image along the optical path from the third mirror to the fifth mirror.

13 Claims, 7 Drawing Sheets

PROJECTION OPTICAL SYSTEM AND EXPOSURE APPARATUS

This application claims a benefit of priority based on Japanese Patent Applications Nos. 2002-325353, filed on Nov. 8, 2002, and 2003-44890, filed on Feb. 21, 2003, each of which is hereby incorporated by reference herein in its entirety as if fully set forth herein.

BACKGROUND OF THE INVENTION

The present invention relates generally to projection optical systems and exposure apparatuses for use with lithography, and more particularly to a catoptric or reflection type projection optical system, an exposure apparatus, and a device fabricating method, which use ultrarviolet ("UV") and extreme ultraviolet ("EUV") light to project and expose an object such as a single crystal substrate for a semiconductor wafer, and a glass plate for a liquid crystal display ("LCD").

Along with recent demands on smaller and lower profile electronic devices, finer semiconductor devices to be mounted onto these electronic devices have been increasingly demanded. For example, a design rule for a mask pattern requires that an image with a size of a line and space ("L & S") of less than 0.1 $\mu$m be extensively formed, and predictably, it will further move to a formation of circuit patterns of less than 80 nm in the future. L & S denotes an image projected to a wafer in exposure with equal line and space widths, and serves as an index of exposure resolution.

A projection exposure apparatus, which is a typical exposure apparatus for fabricating semiconductor devices, includes a projection optical system that projects and exposes a pattern drawn on a mask (reticle) onto a wafer. Resolution R of a projection exposure apparatus (a minimum size which enables a precise transfer of an image) can be given by using a light-source wavelength $\lambda$ and the numerical aperture (NA) of the projection optical system as in the following equation:

$$R = k_1 \times \frac{\lambda}{NA} \quad (1)$$

As the shorter the wavelength becomes and the higher the NA increases, the better the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

As a shorter wavelength of light limits usable glass materials for transmitting the light, it is advantageous for the projection optical system to use reflection elements, i.e., mirrors instead of using many refraction elements, i.e., lenses. No applicable glass materials have been proposed for the EUV light as exposure light, and a projection optical system could not include any lenses. It has thus been proposed to form a catoptic reduction projection optical system only with mirrors.

A mirror in a catoptric reduction projection optical system forms a multilayer film to enhance reflected light and increase reflectance, but the smaller number of mirrors is desirable to increase reflectance of the entire optical system. In addition, the projection optical system preferably uses the even number of mirrors to avoid mechanical interference between the mask and the wafer by arranging the mask and the wafer a: opposite sides with respect to a pupil.

In addition, as the critical dimension (or resolution) required for EUV exposure apparatuses is smaller than a conventional value, higher NA is needed, such as NA=0.2 for a wavelength of 13.5 nm, although conventional three- or four-mirror systems have a difficulty in decreasing wave front aberration. Accordingly, for increased degree of freedom of corrections to wave front aberration, it has been necessary to make a mirror aspheric with the number of mirrors around six (which may be referred to as "six-mirror system" in this application"); many six-mirror systems of this type have been proposed (as seen in Japanese Patent Publications Nos. 2000-100694 and 2000-235144.

Usually, an exposure apparatus locates a mask as an original form of a pattern at an object plane. As this mask should be exchanged and scanned in exposing a pattern, a stage mechanism should be located near the mask at sufficiently wide space when the above six-mirror system is to be applied to an actual exposure apparatus.

As the exposure apparatus is usually accommodated in a clean room, and its entire size is limited due to facility restrictions and thus the span of the optical system is limited. In exposure using the EUV light, it is absorbed in the air and the optical path should be made vacuum. Therefore, the size of the optical system is limited from vacuum drawing efficiency. Thus, there should be a sufficient interval between the object plane and (a reflective surface of) a mirror closest to the object surface without increasing the span of the optical system (a distance from the object plane to the image plane) and the effective diameter.

While the catoptric projection optical system in Japanese Patent Publication No. 2000-100694 discloses two embodiments using six-mirror systems with NA of 0.14 and NA of 0.16, the first embodiment with NA of 0.14 is substantially a five-mirror system because the fourth mirror M4 is a plane mirror, which has a difficulty in increasing NA. In addition, the second embodiment with NA of 0.16 uses a spherical mirror for the fourth mirror M4, increasing the degree of design freedom, but requires a distance from the object plane to the image plane is 2 m or greater and has a difficulty in realization. In addition, the maximum effective diameter of the mirror is about 450 mm, and becomes larger as NA becomes higher.

Either embodiment forms an intermediate image between the second and third mirrors M2 and M3, and arranges four mirrors from the intermediate image to the image plane. Therefore, as a beam width becomes larger with higher NA, a beam enlarges particularly from the intermediate image to the image plane, and has a difficulty in separating mirrors from a beam other than a desired beam and arranging them. Therefore, neither the first embodiment nor the second embodiment can achieve high NA of 0.16 or greater. A compulsory attempt to arrange mirrors would cause another problem to make the maximum effective diameter larger.

Moreover, a distance between the object plane and the mirror M2 closest to the object plane is so small as 20 mm to 30 mm. For example, as shown in FIG. 2, a distance between the second mirror M2 and the mask R is very long. It would be understood from this that it is difficult to apply two optical systems disclosed in Japanese Patent Publication No. 2000-100694 to an actual exposure apparatus.

On the other hand, Japanese Patent Publication No. 2000-235144 also discloses catoptric projection optical systems as six-mirror embodiments with high NAs of 0.2, 0.28 and 0.30. Similarly, however, as a distance between the object plane and the mirror M2 closest to the object plane is so small as 80 mm to 85 mm, it is difficult to arrange a stage mechanism for scanning a mask located on the object plane. In addition, it is the fourth mirror M4 that has the maximum effective diameter in either embodiment, and the diameter is so large as 540 mm or greater for NA of 0.2. The largest effective diameter is a diameter larger than 650 mm for NA of 0.28, and the mirror's maximum effective diameter increases simultaneous with high NA.

BRIEF SUMMARY OF THE INVENTION

Accordingly, it is an exemplary object of the present invention to provide a projection optical system and exposure apparatus applicable to the EUV lithography, which may achieve a six-mirror system with high NA, reduce not only the maximum effective diameter of mirrors but also the span of the optical system, and realize good imaging performance.

A catoptric projection optical system of one aspect according to the present invention for projecting a reduced size of a pattern on an object plane onto an image plane includes first, second, third and fourth mirrors from the image plane along an optical path, wherein the third and fourth mirrors are located between the first mirror and second mirror.

The catoptric projection optical system may include six or more mirrors. The catoptric projection optical system may form an intermediate image between the second and fourth mirrors from the image plane along the optical path. The catoptric projection optical system may form an intermediate image at the third mirror from the image plane along the optical path. The fourth mirror from the image plane along the optical path may have a maximum effective diameter. A changing height direction of a principal ray from the fourth mirror to the first mirror from the image plane along the optical path viewed from an optical axis in each mirror may be opposite to that of a principal ray from the object plane to the fourth mirror from the image plane along the optical path. All of the mirrors in the catoptric projection optical system may be aspheric mirrors having a multilayer film for reflecting EUV light. The catoptric projection optical system may arrange a catoptric mask on the image plane.

The catoptric projection optical system may make a side of the object plane non-telecentric. Light emitted from the object plane may be incident upon the first mirror from the object plane along the optical path at an incident angle from 50° to 10°. An exposure area at a side of the image plane may have a slit width of 0.8 mm or greater. The catoptric projection optical system may include, in order from the image plane to the object plane, the second mirror, the fourth mirror, the third mirror, and the first mirror, wherein the catoptric projection optical system forms an intermediate image between the third and fourth mirrors.

An exposure apparatus of another aspect according to the present invention includes the above catoptric projection optical system, a mask stage for holding a mask that forms a pattern, and for positioning the pattern at the object plane, a wafer stage for holding an object to be exposed having a photosensitive layer and for positioning the photosensitive layer on the image plane, and a scanner mechanism for scanning the mask stage and the wafer stage synchronously when EVU light illuminates the mask.

Alternatively, an exposure apparatus of another aspect according to the present invention includes an illumination optical system for illuminating a pattern using light from a light source, and the above catoptric projection optical system. The catoptric projection optical system projects light reflected from the pattern onto the image plane.

A catoptric projection optical system of another aspect according to the present invention for projecting a reduced size of a pattern formed on a reticle onto an image plane, includes six mirrors for reflecting light, which include, in order from the reticle to the image plane, a concave first mirror (M1), a second mirror (M2), a concave third mirror (M3), a convex fourth mirror (M4), a convex fifth mirror (M5), and a concave six mirror (M6), wherein an intermediate image is formed between the third mirror (M3) and the fifth mirror (M5), and at least one of the six mirrors is an aspheric mirror, the catoptric projection optical system having a numerical aperture of 0.2 or greater, preferably, 0.25 or greater at a side of the image plane, and an effective diameter of each of thee six mirrors being 550 mm or smaller, preferably, 500 mm or smaller.

A catoptric projection optical system of another aspect according to the present invention for projecting a reduced size of a pattern on a reticle onto an image plane includes six mirrors for reflecting light, which include, in order from the reticle to the image plane, a concave first mirror (M1), a second mirror (M2), a concave third mirror (M3), a convex fourth mirror (M4), a convex fifth mirror (M5), and a concave six mirror (M6), wherein an intermediate image is formed between the third mirror (M3) arid the fifth mirror (M5), and at least one of the six mirrors is an aspheric mirror, a maximum incident angle or light to the six mirrors being within 25°.

An exposure apparatus of another aspect according to the present invention includes the above catoptric projection optical system, and and illumination optical system for illuminating the reticle.

A device fabricating method as still another aspect of the present invention includes the steps of using the above exposure apparatus to expose the above object, and performing a predetermined process for the object projected and exposed as above. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
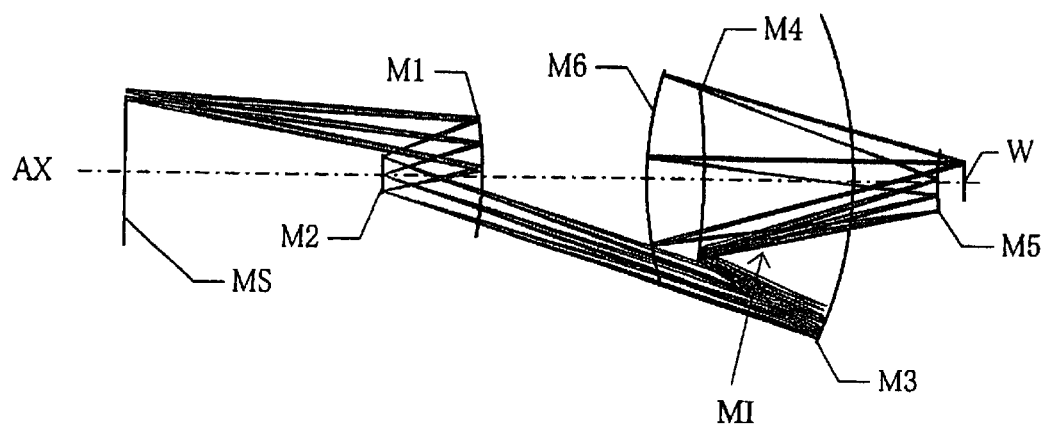
FIG. 1 is a schematic sectional view showing a catoptric projection optical system of a first embodiment and its optical path.

A description will now be given of a catoptic projection optical system and an exposure apparatus 200 as one aspect of the present invention with reference to accompanying drawings. The same reference numeral in each figure denotes the same element. Here, FIG. 1 is a schematic sectional view showing the catoptric demagnification projection optical system 100 of a first embodiment according to the present invention, and its optical path.

Referring to FIG. 1, the inventive catoptric projection optical system 100 is an optical system that projects a reduced size of a pattern on an object plane MS (for example, on a mask surface) onto an image plane W (for example, on a plane of an object to be exposed such as a plate), and particularly art optical system suitable for EUV light (with a wavelength, for example, of 13.4 nm to 13.5 nm).

The catoptric projection optical system 100 includes six mirrors, which basically include, in order of reflecting light from the object plane WS side, a (concave) mirror M1, a (convex) mirror M2, a (concave) mirror M3, a (convex) mirror M4, a (convex) mirror M5 and a (concave) mirror M6, forms an intermediate image M1 near the fourth mirror M4 through the three mirrors including the first mirror M1 to the thud mirror M3 and re-images the intermediate image MI on the image plane W through two mirrors including the fifth mirror M5 and the sixth mirror M6.

Among the six mirrors in the inventive catoptric projection optical system 100, it is the third mirror M3 (having a fourth reflective surface along the optical path from the image plane W) that has the maximum effective diameter, but the maximum effective diameter is characteristically small. In addition, the third mirror M3 and the fourth mirror M4(having a third reflective surface along the optical path from the image plane W) are characteristically arranged between the fifth mirror M5 (having a two reflective surface along the optical path from the image plane W) and the sixth mirror M6(having a first reflective surface along the optical path from the image plane W).

As a consequence, this arrangement may reduce the effective diameter of the third mirror M3, and separate the light from the fourth mirror M4. The effective diameter of the third mirror M3 increases as a distance from the second mirror M2 or from the image plane W increases. Nevertheless, when the third mirror M3 is arranged close to the object plane WS, the fourth mirror M4 interferes with the light. Therefore, the third mirror M3 is preferably arranged between the fifth mirror M5 and the sixth mirror M6.

In order to reduce an incident angle of light upon the sixth mirror M6 a distance between the sixth mirror M6 and the fifth mirror M5 should be made large. The optical performance may be easily secured as a distance between the sixth mirror M6 the image plane W becomes large. Nevertheless, in order to reduce the effective diameter of the sixth mirror M6 and to prevent interference between the fourth mirror M4 and the light, the fourth mirror M4 should be arranged closer to the image plane W to the sixth mirror M6. Therefore, the third mirror M3 and the fourth mirror M4 are arranged between the fifth mirror M5 and the sixth mirror M6. This does not limit the number of mirrors in the catoptric projection optical system 100 to six, and the catoptric projection optical system 100 may have six or more mirrors. When the fourth mirror from the image plane W along the optical path meets the above relationship, the maximum effective diameter may be made small.

Characteristically, the catoptric projection optical system 100 is so non-telecentric that light from the object plane MS to the first mirror MS has an angle of 50° or larger, and the exit light to the image plane W side is telecentric. For example, a certain incident angle is vital for the object plane MS aide so as to enable the illumination optical system to illuminate the mask at the object plane MS and the image to be formed on the wafer at the image plane W. On the other hand, the image plane W side is preferably telecentric, for example, so as to lessen variations of magnification when a wafer at the image plane W moves in the optical-axis direction.

Basically, the catoptric projection optical system 100 is a co-axial optical system that is axially symmetrical around one optical axis, and has an advantage in that aberration is corrected on a ring-shaped image plane area around the optical axis. However, it is unnecessary to arrange six mirrors of the catoptic optical system 100 as a perfect co-axial system, allowing slight decentering for improving aberration and the improved degree of arrangement freedom.

The catoptric projection optical system is considered to be an indispensable optical system for EUV light, and light shielding at the image plane W side should be eliminated as completely as possible for higher NA. In the instant embodiment, the intermediate image MI is formed between the third mirror M3 and the fifth mirror M5 so as to prevent interference between light and the mirrors. The intermediate image MI is preferably formed near the fourth mirror M4 to easily eliminate interference between the light and mirrors.

The first mirror M1 in the catoptric projection optical system 100 is preferably a concave mirror so as to reflect a principal ray emitted from the object plane MS and to approach it to the optical axis direction. The third mirror M3 is preferably a concave mirror so as to direct the light reflected by the second mirror M2 to the optical axis direction. While the second mirror M2 and the fourth mirror M4 relatively have a degree of freedom in power arrangement. Where r1 to r6 are radii of curvature of the first mirror M1 to the sixth mirror M6 Petzval terms indicated in the following Equations 2 and 3 should be nearly zero or preferably zero. When these sums of Petzval terms are considered, the fourth mirror M4 is a convex mirror since the third mirror M3 is a concave mirror, whereby the second mirror M2 can take a free power arrangement.

$$\frac{1}{r_1} - \frac{1}{r_2} + \frac{1}{r_3} - \frac{1}{r_4} + \frac{1}{r_5} - \frac{1}{r_6} \approx 0 \quad (2)$$

$$\frac{1}{r_1} - \frac{1}{r_2} + \frac{1}{r_3} - \frac{1}{r_4} + \frac{1}{r_5} - \frac{1}{r_6} = 0 \quad (3)$$

At least one of the six mirrors in the catoptric projection optical system 100 has an aspheric surface, and a shape of the aspheric surface is given by Equation 4 that expresses general aspheric surfaces. However, making a mirror of an aspheric surface is preferable to correct aberration, and an aspheric surface is formed on as many mirrors as possible (or preferably all of the six mirrors). The inventive catoptric projection optical system 100 is not limited to a six-mirror system, but may use six or more mirrors for high performance and high NA.

$$Z = \frac{ch^2}{1 + \sqrt{1 - (1+k)c^2 k^2}} + Ah^4 + Bh^6 + Ch^8 + Dh^{10} + Eh^{12} + Fh^{14} + Gh^{16} + \ldots \quad (4)$$

In Equation 4, Z is a coordinate of the optical axis direction, "c" a curvature (a reciprocal number of the radius of curvature), "h" a height from the optical axis, "k" a conic constant, A, B, C, D, E, F, G, . . . $4^{th}$ order, $6^{th}$ order, 8th order, $10^{th}$ order, $12^{th}$ order, $14^{th}$ order, $16^{th}$ order . . . aspheric coefficients, respectively.

The catoptric optical system 100 arranges, as shown in FIG. 1, an aperture stop on the second mirror M2, but may arrange it on the first mirror M1 or between the first mirror M1 and the second mirror M2. A diameter of the aperture stop may be fixed or variable. In case of variable diameter, a change of a diameter of the aperture stop would advantageously provide a large depth of focus, thereby stabilizing images.

A multilayer film for reflecting the EUV light is applied onto the first to sixth mirrors M1 to M6, and the multilayer film has an effect to enhance the light. It is conceivable that a multilayer film that may reflect the EUV light having a wavelength of less than 20 nm includes, for example, a molybdenum (Mo)/silicon (Si) multilayer film that alternately laminates Mo and Si layers or a molybdenum (Mo)/beryllium (Be) multilayer film that alternately laminates Mo and Be layers, and an optimal material is selected in view of use wavelength. Of course, the present invention does not limit the multilayer film to the above materials, and may use any multilayer film that has an operation or effect similar to that of the above.

[First Embodiment]

Referring now to FIG. 1, a description will be given of a result of an illumination test using the catoptric projection system 100 of the first embodiment according to the present invention. In FIG. 1, MS is a mask located at the object plane position and W is a wafer located at the image plane position.

The catoptric projection optical system 100 illuminates the mask MS through an illumination system (not shown) that emits the EUV light having a wavelength around 13.4 nm, and the reflected EUV light from the mask MS reflects the first (concave) mirror M1, the second mirror M2, the third (concave) mirror M3, the fourth (convex) mirror M4, the fifth (convex) mirror M5, and the sixth (concave) mirror M6 in this order, and forms a reduced size of a mask pattern on the wafer W located at the image plane position.

Structurally, the catoptric projection optical system 100 forms the intermediate image MI through three mirrors, or the first to third mirrors M1 to M3 and the remaining mirrors re-form the intermediate image MI on the wafer W. This embodiment makes the second mirror M2 of a convex mirror, and forms the intermediate image MI near the fourth mirror M4.

The catoptric projection optical system 100 shown in FIG. 1 has the numerical aperture at the image side NA of 0.26, a reduction magnification of ¼ times, and an arc-shaped slit with a width of 4mm for object point of 122 mm to 126 mm. Table 1 shows numerical values (such as radii of curvature, spacing of lattice planes, and aspheric coefficients) of the catoptric projection optical system 100 shown in FIG. 1.

TABLE 1

| MIRROR NOs. | RADII OF CURVATURE | SPACING OF LATTICE PLANES |
|---|---|---|
| MS (MASK) | ∞ | 581.067 |
| M1 | −532.76 | −161.654 |
| M2 | −861.117 | 768.177 |
| M3 | −591.482 | −245.206 |
| M4 | −972.465 | 380.744 |
| M5 | 309.875 | −474.365 |
| M6 | 550.778 | 518.365 |
| W (WAFER) | ∞ | |

| ASPHERIC COEFFICIENTS | K | A | B | C |
|---|---|---|---|---|
| M1 | 5.0192 | 6.63760E−09 | −156445E−14 | 3.86207E−18 |
| M2 | −101.7500 | −6.07279E−09 | 2.44758E−12 | 5.56571E−17 |
| M3 | −0.4672 | −1.68937E−10 | 1.24438E−16 | −2.71843E−20 |
| M4 | −20.4858 | 7.45018E−10 | −2.91369E−14 | −6.82259E−19 |
| M5 | −1.7425 | 1.13717E−08 | 1.93024E−12 | −2.62927E−16 |
| M6 | −0.0271 | −1.87047E−12 | −6.31956E−18 | 5.88413E−22 |

| ASPHERIC COEFFICIENTS | D | E | F | G |
|---|---|---|---|---|
| M1 | −1.87843E−22 | 9.48881E−27 | −9.66476E−32 | −8.00305E−36 |
| M2 | 4.1169E−21 | 6.83807E−24 | −4.36330E−27 | 1.17221E−35 |
| M3 | 1.02024E−25 | 5.38107E−30 | −7.95164E−35 | 3.41649E−40 |

TABLE 1-continued

| | | | | |
|---|---|---|---|---|
| M4 | −5.18346E−23 | 2.04602E−27 | 2.30061E−31 | −8.25630E−36 |
| M5 | 1.58672E−19 | −6.42246E−23 | 1.51281E−26 | −1.49457E−30 |
| M6 | −5.90319E−26 | 2.82238E−30 | −7.00304E−35 | 6.88577E−40 |

Table 2 shows aberration that includes no manufacture errors in the catoptric projection optical system 100 shown in FIG. 1 for each angle of view:

TABLE 2

| OBJECT POINTS (mm) | WAVE FRONT ABERRATION (rms) |
|---|---|
| 122 | 0.0374 λ |
| 124 | 0.0248 λ |
| 126 | 0.0558 λ |

Referring to Table 2, |Maximum Distortion|=2.87 nm.

A minimum distance between the object plane MS and the reflection surface (or a distance between the object plane MS and the second mirror M2) is 419.4 mm, enough to avoid interference with a stage mechanism of the object plane MS and illumination system. The third mirror M3 has a relatively small maximum effective diameter of 496.4 mm. An inclination of principal ray from the object plane MS to the first mirror M1 is about 7° enough to illuminate the mask MS located on the object plane position through the illumination system, and form an image on the wafer W located at the image plane position.

[Second Embodiment]

Figure 2:
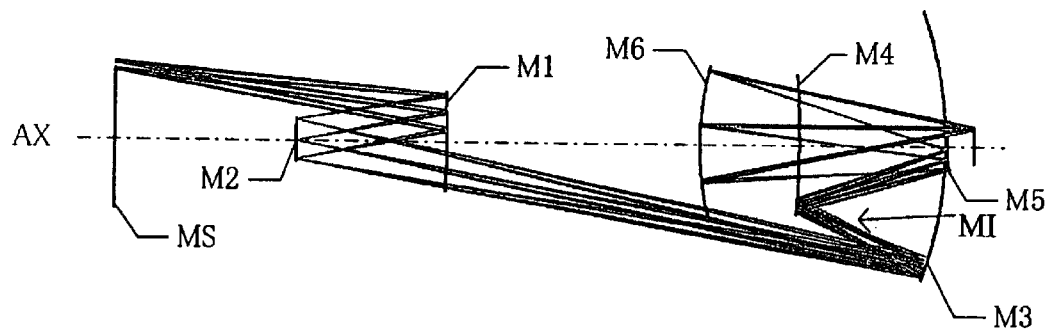
FIG. 2 is a schematic sectional view showing a catoptric projection optical system of a second embodiment and its optical path.

Referring now to FIG. 2, a description will be given of a result of an illumination test using a catoptric projection system 100A as a second embodiment according to the present invention. FIG. 2 is a schematic sectional view showing a catoptric projection optical system 100A of the second embodiment and its optical path. In FIG. 2, MS is a catoptric mask located at the object plane position and W is a wafer located at the image plane position.

The catoptic projection optical system 100A illuminates the mask MS through an illumination system (not shown) that emits the EUV light having a wavelength around 13.4 nm, and the reflected EUV light from the mask MS reflects the first (concave) mirror M1, the second mirror M2, the third (concave) mirror M3 the fourth (convex) mirror M4 the fifth (convex) mirror M5 and the sixth (concave) mirror M6 in thus order, and forms a reduced size of a mask pattern on the wafer W located at the image plane position.

Structurally, the catoptric projection optical system 100A forms the intermediate image MI through three mirrors, or the first to third mirrors M1 to M3 and the remaining mirrors re-form the intermediate image MI on the wafer W. This embodiment makes the second mirror M2 of a concave mirror, and forms the intermediate image MI between the third and fourth mirrors M3 and M4.

The catoptric projection optical system 100A shown in FIG. 2 has the numerical aperture at the image side NA of 0.2, a reduction magnification of ¼, and an arc-shaped slit with a width of 4 mm for object point of 118 mm to 122 mm. Table 3 shows numerical values (such as radii of curvature, spacing of lattice planes, and aspheric coefficients) of the catoptric projection optical system 100A shown in FIG. 2.

TABLE 3

| MIRROR NOs. | RADII OF CURVATURE | SPACING OF LATTICE PLANES |
|---|---|---|
| MS (MASK) | ∞ | 537.842 |
| M1 | −1465.55 | −243.584 |
| M2 | 1500 | 1050.92 |
| M3 | −602.189 | −234.849 |
| M4 | −1166.99 | 237.404 |
| M5 | 235.677 | −401.363 |
| M6 | 466.992 | 445.363 |
| W (WAFER) | ∞ | |

| ASPHERIC COEFFICIENTS | K | A | B | C |
|---|---|---|---|---|
| M1 | −87.9603 | 1.53133E−09 | −3.48543E−13 | 3.42921E−17 |
| M2 | −0.1142 | 4.11163E−09 | 1.61416E−13 | 2.72128E−17 |
| M3 | −0.3071 | 4.09715E−10 | 7.98901E−16 | −2.64411E−20 |
| M4 | −0.7060 | 1.82346E−09 | 1.87885E−13 | 1.87469E−17 |
| M5 | 0.6103 | −6.44620E−09 | 1.49110E−11 | −3.18041E−15 |
| M6 | 0.0031 | 4.54351E−12 | −1.23324E−16 | 1.49354E−20 |

| ASPHERIC COEFFICIENTS | D | E | F | G |
|---|---|---|---|---|
| M1 | −1.99972E−21 | −3.64266E−26 | 1.44221−29 | −6.66808E−34 |
| M2 | −2.16871E−20 | 1.19733E−23 | −1.89512E−27 | −2.11820E−31 |
| M3 | −8.34208E−25 | 2.26571E−30 | 3.58302E−34 | −3.17613E−39 |
| M4 | −2.10147E−21 | −6.71237E−26 | 1.29276E−29 | −3.67142E−34 |
| M5 | 2.07279E−19 | 6.48371E−22 | −3.46942E−25 | 5.94278E−29 |
| M6 | −2.03237E−24 | 1.37369E−28 | −4.76734E−33 | 6.57963E−38 |

Table 4 shows aberration that includes no manufacture errors in the catoptric projection optical system 100A shown in FIG. 2 for each angle of view:

TABLE 4

| OBJECT POINTS (mm) | WAVE FRONT ABERRATION (rms) |
|---|---|
| 118 | 0.0680 λ |
| 120 | 0.0595 λ |
| 122 | 0.0909 λ |

Referring to Table 4, |Maximum Distortion|=17.8 nm.

A minimum distance between the object plane MS and the reflection surface (or a distance between the object plane MS and the second mirror M2) is 294.258 mm, enough to avoid interference with a stage mechanism of the object plane MS and illumination system. The third mirror M3 has a relatively small maximum effective diameter of 413.12 mm. An inclination of principal ray from the object plane MS to the first mirror M1 is about 7.60, enough to illuminate the mask MS located on the object plane position through the illumination system, and form an image on the wafer W located at the image plane position.

Figure 3:
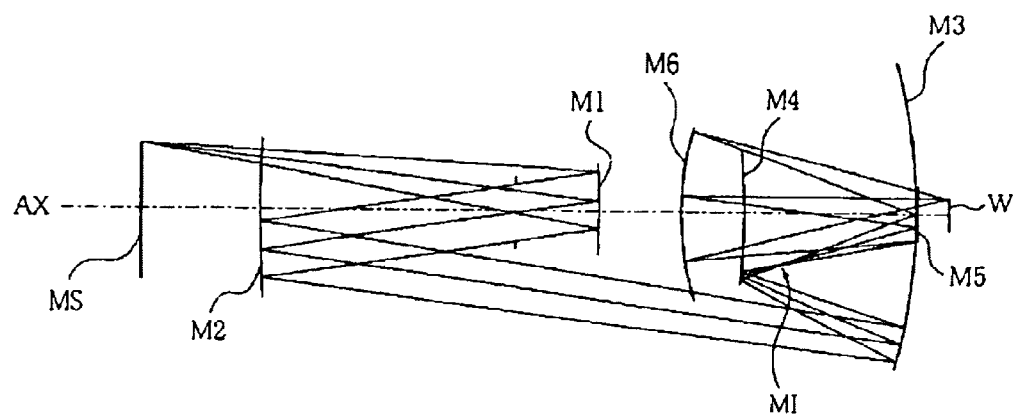
FIG. 3 is a schematic sectional view showing a catoptric projection optical system of a third embodiment and its optical path.

A projection optical system shown in FIG. 3 has six mirrors, basically including in order of reflecting light from the object plane WS side, a (concave) mirror M1, a (concave) mirror M2, a (concave) mirror M3, a (convex) mirror M4, a (convex) mirror M5 and a (concave) mirror M6, forms an intermediate image MI through the four mirrors including the first mirror M1 to the fourth mirror M4, and re-images the intermediate image MI on the image plane W through two mirrors including the fifth mirror M5 and the sixth mirror M6.

The present invention may take various forms of power of the second mirror M2 and a position of an intermediate image. For example, third and seventh embodiments shown in FIGS. 3 and 7 make the second mirror M2 of a concave mirror and form an intermediate image between the fourth and fifth mirrors M4 and M5. A fourth embodiment shown in FIG. 4 makes the second mirror M2 of a concave mirror and form an intermediate image between the third and fourth mirrors M3 and M4. A fifth embodiment shown in FIG. 5 makes the second mirror M2 of a convex mirror and form an intermediate image between the fourth and fifth mirrors M4 and M5. A sixth embodiment shown in FIG. 6 makes the second mirror M2 of a aspheric plane mirror and form an intermediate image between the fourth and fifth mirrors M4 and M5.

Figure 7:
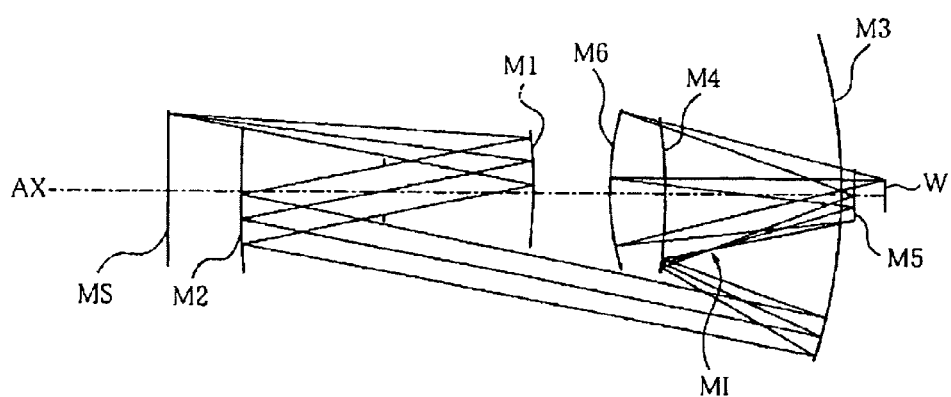
FIG. 7 is a schematic sectional view showing a catoptric projection optical system of a seventh embodiment and its optical path.

In respective embodiments shown in FIGS. 3 and 7, among the six mirrors in the inventive catoptric projection optical system 100, it is the third mirror M3 that has the maximum effective diameter, but the maximum effective diameter is characteristically small. In addition, it is the fourth mirror M4 that has the maximum incident angle, and the maximum incident angle is characteristically small. Detailed values will be described later.

Characteristically, the projection optical system of each embodiment is so non-telecentric that light from the object plane MS to the first mirror MS has an angle of 50° or larger. This feature means that the object side has an incident angle of light that is obliquely incident upon the object surface so as to enable the illumination optical system (not shown) to illuminate the catoptric mask at the object plane MS and a circuit pattern to be formed on the wafer surface at the image plane W using the reflection light from this reticle. On the other hand, the image plane W side is preferably telecentric so as to lessen variations of magnification when a wafer at the image plane W moves in the optical-axis direction.

Here, a desired optical system may be prepared which separates light from mirrors by arranging the intermediate image between the third mirror M3 and the fifth mirror M5, and increasing powers of the fifth and sixth mirrors M5 and M6. In addition, it is preferable to make the fifth mirror M5 of a concave mirror and the sixth mirror M6 of a convex mirror for the large image side numerical aperture NA and imaging with a back focus of a desired distance.

While the third to sixth embodiments shown in FIGS. 3 to 6 arranges an aperture stop between the first mirror M1 and the second mirror M2, they may arrange the aperture stop at the same position as the first mirror M1 or the second mirror M2. In addition, as shown in the seventh embodiment shown in FIG. 7, a circular aperture stop may be arranged without light shielding above and below the stop position. The stop diameter may be fixed or variable. In case of the variable aperture stop, a change of the diameter of the aperture stop would change NA in the optical system.

[Third Embodiment]

A detailed description will be given of third to seventh embodiments shown in FIGS. 3 through 7. Table 5 shows details (of design data) about the catoptric projection system of the third embodiment shown in FIG. 3.

The optical system of the third embodiment has a numerical aperture at the image side NA of 0.26, a magnification of ¼ times, and an arc-shaped slit with a width of 1 mm for object point of 112mm to 116 mm. This optical system's aberration (calculated at several points of the image height) which includes no manufacture error is wave front aberration of 0.016λ rms, and maximum distortion of 0.9 nm. A minimum distance between the object plane MS and the reflection surface (or a distance between the object plane MS and the second mirror M2) is 195.5 mm, enough to avoid interference with a stage mechanism of the object plane MS and illumination system. The third mirror M3 has a relatively small maximum effective diameter of 491 6 mm. It is the fourth mirror M4 that has the maximum incident angle of light, and the maximum incident angle of light is 24.3°. The maximum incident angle of light incident upon this mirror M4 is preferably 27° or smaller, more preferably 25° or smaller, for example, 21". It is conceivable that an excessively large incident angle would deteriorate the reflection characteristic, and it is important to make all of the incident angles of all mirrors as small as possible. An inclination θ of principal ray to an optical axis AX from the object plane MS to the first mirror M1 is 7. 01256°, which is a structure enough to irradiate arc-shaped EUV light onto the catoptric mask MS located on the object plane MS position through the illumination system, and forms an image on the wafer W located at the image plane position. Here, the optical axis AX is a line that substantially connects a center of radius of curvature of each mirror surface or an axis of a rotational center of each mirror surface. Of course, when mirrors are decentered, each mirror has a slightly shifted center of radius of curvature. The inclination θ of principal ray to the optical axis AX from the object plane MS to the first mirror M1 is preferably 50° to 10°, more preferably 6.° to 8.5°, most preferably greater than 6.8° and/or below 7.5°.

TABLE 5

| MIRROR NOs. | RADII OF CURVATURE | SPACING OF LATTICE PLANES |
|---|---|---|
| MS (MASK) | ∞ | 741.957816 |
| M1 | −1300.38417 | −546.461665 |
| M2 | 8693.90779 | 1068.483153 |
| M3 | −784.53254 | −289.748077 |
| M4 | −1538.40167 | 289.876228 |
| M5 | 279.13452 | −389.149638 |
| M6 | 456.62288 | 433.149638 |
| W (WAFER) | ∞ | |

| ASPHERIC COEFFICIENTS | K | A | B |
|---|---|---|---|
| M1 | 32.690645 | 0.386704E−08 | 0.537232E−13 |
| M2 | 3088.854528 | −0.139891E−08 | −0.103829E−13 |
| M3 | 0.057653 | 0.547488E−10 | 0.116646E−14 |
| M4 | −82.929831 | −0.784255E−08 | 0.707055E−12 |
| M5 | 2.988255 | −0.625088E−08 | −0.137806E−11 |
| M6 | −0.000127 | 0.126630E−09 | 0.700598E−15 |

| ASPHERIC COEFFICIENTS | C | D |
|---|---|---|
| M1 | −0.306285E−18 | 0.302730E−21 |
| M2 | −0.464284E−18 | 0.150357E−22 |
| M3 | 0.890059E−20 | −0.721730E−24 |
| M4 | −0.339135E−16 | 0.512280E−21 |
| M5 | −0.182571E−15 | 0.742272E−19 |
| M6 | 0.465345E−20 | −0.149197E−24 |

[Fourth Embodiment]

Figure 4:
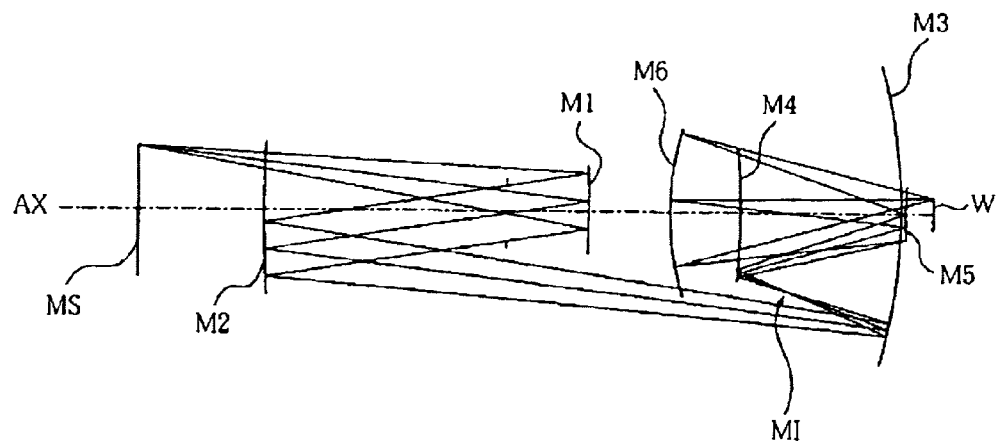
FIG. 4 is a schematic sectional view showing a catoptric projection optical system of a fourth embodiment and its optical path.

Table 6 shows details (of design data) about the catoptric projection system of the fourth embodiment shown in FIG. 4. This optical system has a numerical aperture at the image side NA of 0.26, a magnification of ¼ times, and an arc-shaped slit with a width of 1 mm for object point of 112 mm to 116 mm. This optical system's aberration (calculated at several points of the image height) which includes no manufacture error is wave front aberration of 0.028λ rms, and maximum distortion of 0.6 nm. A minimum distance between the object plane MS and the reflection surface (or a distance between the object plane MS and the second mirror M2) is 213.5 mm, enough to avoid interference with a stage mechanism of the object plane MS and illumination system. The third mirror M3 has a relatively small maximum effective diameter of 417.8 mm. it is the fourth mirror M4 that has the maximum incident angle of light, and the maximum incident angle of light is 22.3°. It is conceivable that an excessively large incident angle would deteriorate the reflection characteristic, and it is important to make all of the incident angles of all mirrors as small as possible. An inclination θ of principal ray from the object plane MS to the first mirror M1 is 7.1491°, which is a structure enough to irradiate arc-shaped EUV light onto the catoptric mask MS located on the object plane MS position through the illumination system, and forms an image on the wafer W located at the image plane position.

TABLE 6

| MIRROR NOs. | RADII OF CURVATURE | SPACING OF LATTICE PLANES |
|---|---|---|
| MS (MASK) | ∞ | 742.424016 |
| M1 | −1235.95031 | −528.930677 |
| M2 | 3950.61297 | 1043.901187 |
| M3 | −778.78384 | −262.923255 |
| M4 | −2382.07643 | 273.389807 |
| M5 | 251.24630 | −391.821324 |
| M6 | 460.16770 | 435.821773 |
| W (WAFER) | ∞ | |

TABLE 6-continued

| ASPHERIC COEFFICIENTS | K | A | B |
|---|---|---|---|
| M1 | 28.643108 | 0.421671E−08 | 0.623673E−13 |
| M2 | 815.490443 | −0.254320E−08 | −0.400101E−13 |
| M3 | −0.322260 | 0.181482E−09 | −0.414469E−14 |
| M4 | −245.724758 | −0.558207E−08 | 0.587111E−12 |
| M5 | 2.515869 | −0.765657E−08 | −0.151490E−11 |
| M6 | −0.021940 | −0.163890E−09 | 0.898547E−15 |

| ASPHERIC COEFFICIENTS | C | D |
|---|---|---|
| M1 | −0.593826E−18 | 0.401823E−21 |
| M2 | −0.238508E−17 | 0.146681E−21 |
| M3 | 0.412265E−19 | 0.293533E−24 |
| M4 | −0.336911E−16 | 0.230253E−21 |
| M5 | −0.232865E−15 | 0.138789E−18 |
| M6 | 0.606275E−20 | −0.228281E−24 |

[Fifth Embodiment]

Figure 5:
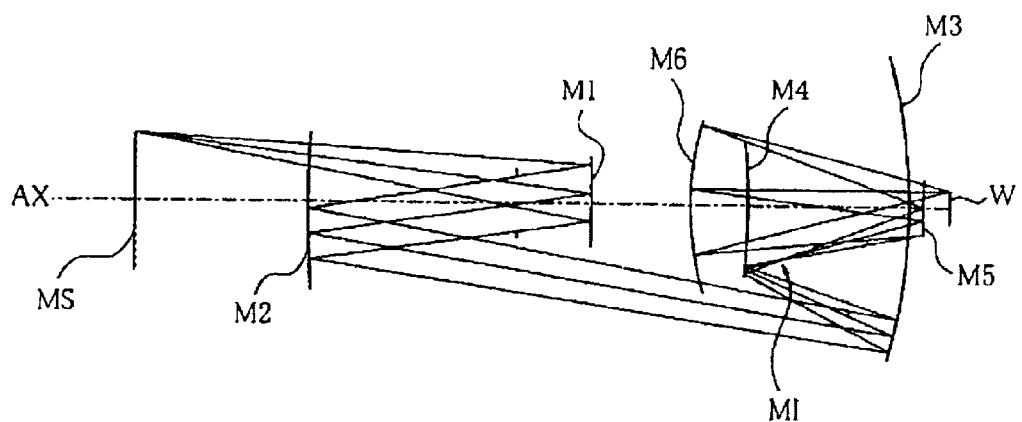
FIG. 5 is schematic sectional view showing a catoptric projection optical system of a fifth embodiment and its optical path.

Table 7 shows details (of design data) about the catoptic projection system of the fifth embodiment shown in FIG. 5. This optical system has a numerical aperture at the image side NA of 0.26, a magnification of ¼ times, and, an arc-shaped slit with a width of 1 mm for object point of 112 mm to 116 mm. This optical system's aberration (calculated at several points of the image height) which includes no manufacture error is wave front aberration of 0.023λ nms, and maximum distortion of 1.9 nm. A minimum distance between the object plan MS and the reflection surface (or a distance between the object plane MS and the second mirror M2) is 295.2 mm, enough to avoid interference with a stage mechanism of the object plane MS and illumination system. The third mirror M3 has a relatively small maximum effective diameter of 474.4 mm. It is the fourth mirror M4 that has the maximum incident angle of light, and the maximum incident angle of light is 24.6°. It is conceivable that an excessively large incident angle would deteriorate the reflection characteristic, and it is important to make all of the incident angles of all mirrors as small as possible. An inclination θ of principal ray from the object plane MS to the first mirror M1 is 7.13054°, which is a structure enough to irradiate arc-shaped EUV light onto the catoptric mask MS located on the object plane MS position through the illumination system, and forms an image on the wafer W located at the image plane position.

TABLE 7

| MIRROR NOs. | RADII OF CURVATURE | SPACING OF LATTICE PLANES |
|---|---|---|
| MS (MASK) | ∞ | 757.792282 |
| M1 | 1142.93194 | −462.608190 |
| M2 | −950.68722 | 996.767753 |
| M3 | −730.02843 | −269.378792 |
| M4 | −3989.00975 | 289.107273 |
| M5 | 273.68760 | −384.526446 |
| M6 | 452.15971 | 428.526466 |
| W (WAFER) | ∞ | |

| ASPHERIC CO-EFFICIENTS | K | A | B |
|---|---|---|---|
| M1 | 30.101770 | 0.457067E−08 | 0.649962E−13 |
| M2 | −0.389903e23 | −0.149771E−08 | 0.389969E−14 |

TABLE 7-continued

| | | | |
|---|---|---|---|
| M3 | 0.069982 | 0.828993E−10 | 0.483894E−15 |
| M4 | 1028.34794 | −0.343302E−07 | 0.221135E−11 |
| M5 | 3.007825 | −0.580258E−08 | −0.137509E−11 |
| M6 | −0.007383 | 0.157911E−09 | 0.883419E−15 |

| ASPHERIC COEFFICIENTS | C | D |
|---|---|---|
| M1 | −0.475094E−18 | 0.448824E−21 |
| M2 | −0.505910E−18 | 0.982068E−22 |
| M3 | 0.287047E−19 | −0.905349E−24 |
| M4 | 0.581059E−17 | −0.205628E−20 |
| M5 | −0.129613E−16 | −0.980544E−19 |
| M6 | 0.576235E−20 | −0.194841E−24 |

[Sixth Embodiment]

Figure 6:
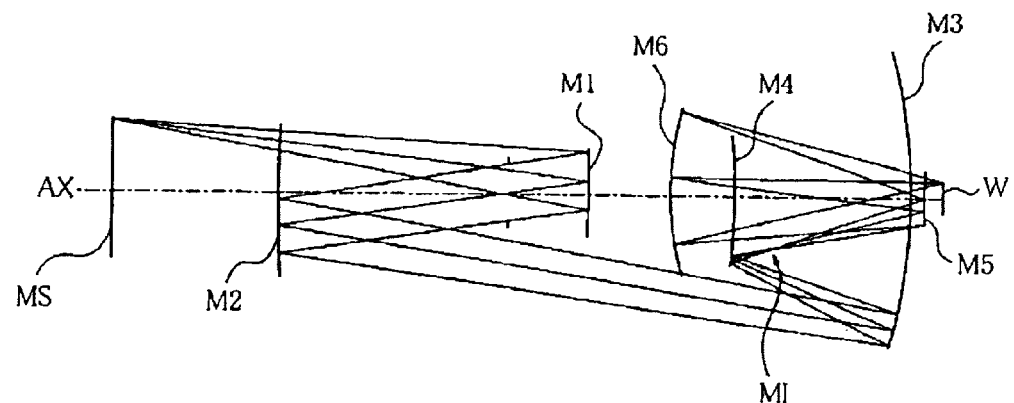
FIG. 6 is a schematic sectional view showing a catoptric projection optical system of a sixth embodiment and its optical path.

Table 8 shows details (of design data) about the catoptric projection system of the sixth embodiment shown in FIG. 6. This optical system has a numerical aperture at the image side NA of 0.26, a magnification of ¼ times, and an arc-shaped slit with a width of 1 mm for object point of 112 mm to 116 mm. This optical system's aberration (calculated at several points of the image height) which includes no manufacture error is wave front aberration of 0.017λ rms, and maximum distortion of 0.8 nm. A minimum distance between the object plane MS and the reflection surface (or a distance between the object plane MS and the second mirror M2) is 266.8 mm, enough to avoid interference with a stage mechanism of the object plane MS and illumination system. The third mirror M3 has a relatively small maximum effective diameter of 489.3 mm. It is the fourth mirror M4 that has the maximum incident angle of light, and the maximum incident angle of light is 24.9°. It is conceivable that an excessively large incident angle would deteriorate the reflection characteristic, and it is important to make all of the incident angles of all mirrors as small as possible. An inclination θ of principal ray from the object plane MS to the first mirror M1 is 7.1271°, which is a structure enough to irradiate arc-shaped EUV light onto the catoptric mask MS located on the object plane MS position through the illumination system, and forms an images on the wafer W located at the image plane position.

TABLE 8

| MIRROR NOs. | RADII OF CURVATURE | SPACING OF LATTICE PLANES |
|---|---|---|
| MS (MASK) | ∞ | 752.156946 |
| M1 | −1177.68696 | −485.349741 |
| M2 | ∞ | 1002.430484 |
| M3 | −738.17974 | −282.095368 |
| M4 | −1352.47656 | 282.096963 |
| M5 | 281.59995 | −384.082338 |
| M6 | 451.59964 | 428.082338 |
| W (WAFER) | ∞ | |

| ASPHERIC CO-EFFICIENTS | K | A | B |
|---|---|---|---|
| M1 | 29.805867 | 0.430702E−08 | 0.600860E−13 |
| M2 | −0.131376e10 | −0.132268E−08 | 0.247804E−14 |
| M3 | 0.047093 | 0.407894E−10 | 0.156938E−14 |
| M4 | −48.658930 | −0.869938E−08 | 0.782306E−12 |
| M5 | 2.803832 | −0.386728E−08 | −0.122630E−11 |
| M6 | −0.003207 | 0.146852E−09 | 0.824012E−15 |

TABLE 8-continued

| ASPHERIC COEFFICIENTS | C | D |
|---|---|---|
| M1 | −0.561752E−18 | 0.458634E−21 |
| M2 | −0.182986E−18 | 0.287602E−22 |
| M3 | 0.384385E−20 | −0.747896E−24 |
| M4 | −0.318330E−16 | 0.180127E−21 |
| M5 | −0.134115E−15 | 0.409116E−19 |
| M6 | 0.577858E−20 | −0.217442E−24 |

[Seventh Embodiment]

Table 9 shows details (or design data) about the catoptric projection system of the seventh embodiment shown in FIG. 7. This optical system has a numerical aperture at the image side NA of 0.26, a magnification of ¼ times, and an arc-shaped slit with a width of 1 mm for object point of 130 mm to 134 mm. This optical system's aberration (calculated at several points of the image height) which includes no manufacture error is wave front aberration of 0.032λ rms, and maximum distortion of 6.7 nm. The seventh embodiment has the same basic configuration, such as power arrangement, as the third embodiment, and thus exhibits similar effects to those of the third embodiments.

TABLE 9

| MIRROR NOs. | RADII OF CURVATURE | SPACING OF LATTICE PLANES |
|---|---|---|
| MS (MASK) | ∞ | 625.699969 |
| M1 | −1212.56123 | −500.523657 |
| M2 | 5793.46814 | 1037.4516 |
| M3 | −802.15379 | −308.755250 |
| M4 | −2088.18412 | 325.098794 |
| M5 | 281.95597 | −420.271487 |
| M6 | 497.08568 | 477.823579 |
| W (WAFER) | ∞ | |

| ASPHERIC COEFFICIENTS | K | A | B |
|---|---|---|---|
| M1 | 30.424965 | 0.420308E−08 | −0.363965E−13 |
| M2 | 970.599385 | −0.816088E−09 | −0.421883E−14 |
| M3 | −0.111884 | −0.719514E−11 | 0.141520E−14 |
| M4 | 93.369312 | −0.796297E−08 | 0.896867E−12 |
| M5 | 1.790339 | −0.100532E−07 | 0.241277E−11 |
| M6 | −0.047254 | 0.955354E−10 | 0.410649E−15 |

| ASPHERIC COEFFICIENTS | C | D |
|---|---|---|
| M1 | 0.285354E−17 | 0.150386E−22 |
| M2 | −0.392497E−18 | 0.192731E−22 |
| M3 | 0.421625E−21 | −0.255878E−24 |
| M4 | −0.347980E−16 | 0.124098E−21 |
| M5 | −0.264965E−15 | −0.888211E−19 |
| M6 | 0.215625E−20 | −0.767988E−25 |

As discussed above, the inventive projection optical system may make NA larger than 0.2 (preferably larger than 0.25) in an EUV wavelength range, and reduce the maximum effective diameter of the mirror and the span of the optical system irrespective of high NA. It may sufficiently secure a minimum distance between the object plane MS and the mirror, and prevent interference between the stage mechanism of the object plane MS and the illumination system. The object plane MS side is non-telecentric enough to illuminate the mask located at the object plane MS and form an image on the image plane W, providing good imaging performance.

Figure 8:
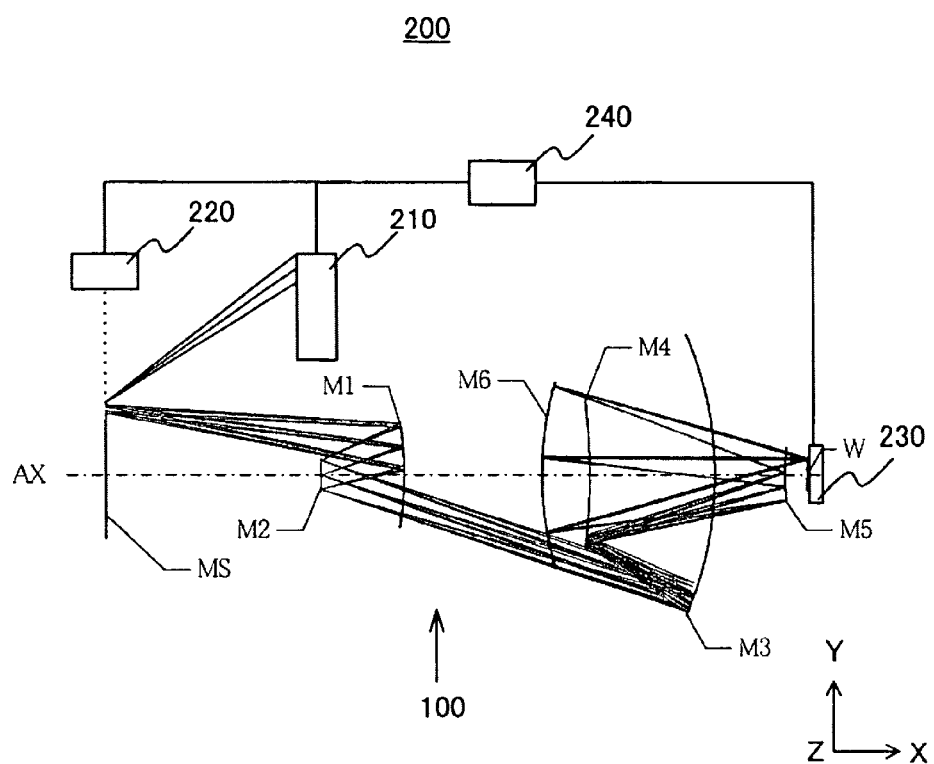
FIG. 8 is a schematic structure of an exemplary exposure apparatus having the catoptric projection system.

Referring now to FIG. 8, a description will be given of an exposure apparatus 200 to which the inventive catoptric projection optical system 100 is applied. FIG. 8 is a schematic structure of an exemplary exposure apparatus having the catoptric projection system. The inventive exposure apparatus 200 is a projection exposure apparatus that uses, as illumination light, EUV light (e.g., with a wavelength or 13.4 nm) in a step-and-scan manner.

Referring to FIG. 8, the exposure apparatus 200 includes an illumination apparatus 210, a mask MS, a mask stage 220 mounted with the mask MS, the catoptic projection optical system 100, an object to be exposed W, a wafer stage 230 mounted with the object W, and a controller 240. The controller 240 is connected so that it can control the illumination apparatus 210, mask stage 220 and the wafer stage 230.

Although not shown in FIG. 8, it is preferable that the optical path has a vacuum atmosphere where at least the EUV passes through since the EUV light has low transmittance to the air. In FIG. 8, X, Y and Z denote a three-dimensional space, and a normal direction of an XY plane is made to be direction Z.

The illumination apparatus 210 is an illumination apparatus that uses arc-shaped EUV light (e.g.. with a wavelength of 13.4 nm) corresponding to an arc-shaped field of the catoptric projection optical system 100 to illuminate the mask MS, and is comprised of a light source (not shown) and an illumination optical system. Any known technique can be applied to the light source and the illumination optical system in the illumination apparatus 210, and a detailed description thereof will be omitted in the present specification. For example, the illumination optical system includes a condenser optical system, an optical integrator, an aperture stop, a blade, etc., and any technique known to those skilled in the art is applicable.

The mask MS is a catoptric or transmission mask, on which a circuit pattern (or an image) to be transferred is farmed and which is supported and driven by the mask stage 220. Diffracted light from the mask MS is reflected on the projection optical system 100, and projected onto the object W. The mask MS and the plate W are disposed in an optically conjugate relationship. Since the exposure apparatus 200 of the present embodiment is a step-and-scan type exposure apparatus, scan of the mask MS and the object W transfers the pattern on the mask MS onto the object W.

The mask stage 220 supports the mask MS, and is connected to a transport mechanism (not shown). Any structure known in this art is applicable to the mask stage 220. The transport mechanism can be composed by a linear motor, and can move the mask MS by driving the mask stage 220 at least in Y direction under the control of the controller 240. The exposure apparatus 200 scans the mask MS and the object W in a state synchronized by the controller 240.

The catoptic projection optical system 100 is one that projects a reduced size of the pattern on the mask MS onto the image plane. Any structure as described above is applicable to the catoptic projection optical system 100, and a detailed description thereof is omitted. While FIG. 8 uses the catoptric projection optical system 100 shown in FIG. 1, such a structure is exemplary, and the present invention is not limited to this. For example, the inventive projection optical system 100A may be used.

While the object W in the instant embodiment is a wafer, it may widely include a liquid crystal plate, and other objects. Photoresist is applied onto the object W.

The wafer stage 230 supports the object W. The stage 230 uses, for example, a linear motor to move the object W in X-Y-Z directions. The positions of the mask stage 220 and wafer stage 230 are monitored, for example, by a laser interferometer and the like, so that both are driven at a constant speed ratio.

The controller 240 includes a CPU and a memory (not shown), and controls the operations of the exposure apparatus 200. The controller 240 is electrically connected with the illumination apparatus 210, the mask stage 220 (namely, the transport mechanism (not shown) of the mask stage 220), and the wafer stage 230 (namely, the transport mechanism (not shown) of the wafer stage 230). The CPU includes any kinds of processors regardless of whatever names may be such as MPS, thereby controlling the operation of each part. The memory includes a ROM and a RAM, which store firmware to operate the exposure apparatus 210.

In exposure, the EUV light emitted from the illumination apparatus 210 illuminates the mask MS, and forms a pattern image on the mask MS onto a surface of the object W. In the instant embodiment, the image plane is an arc-shaped (ring-shaped) image plane, and the whole area of the mask can be exposed by scanning the mask and wafer at the speed ratio of the reduction ratio.

Figure 9:
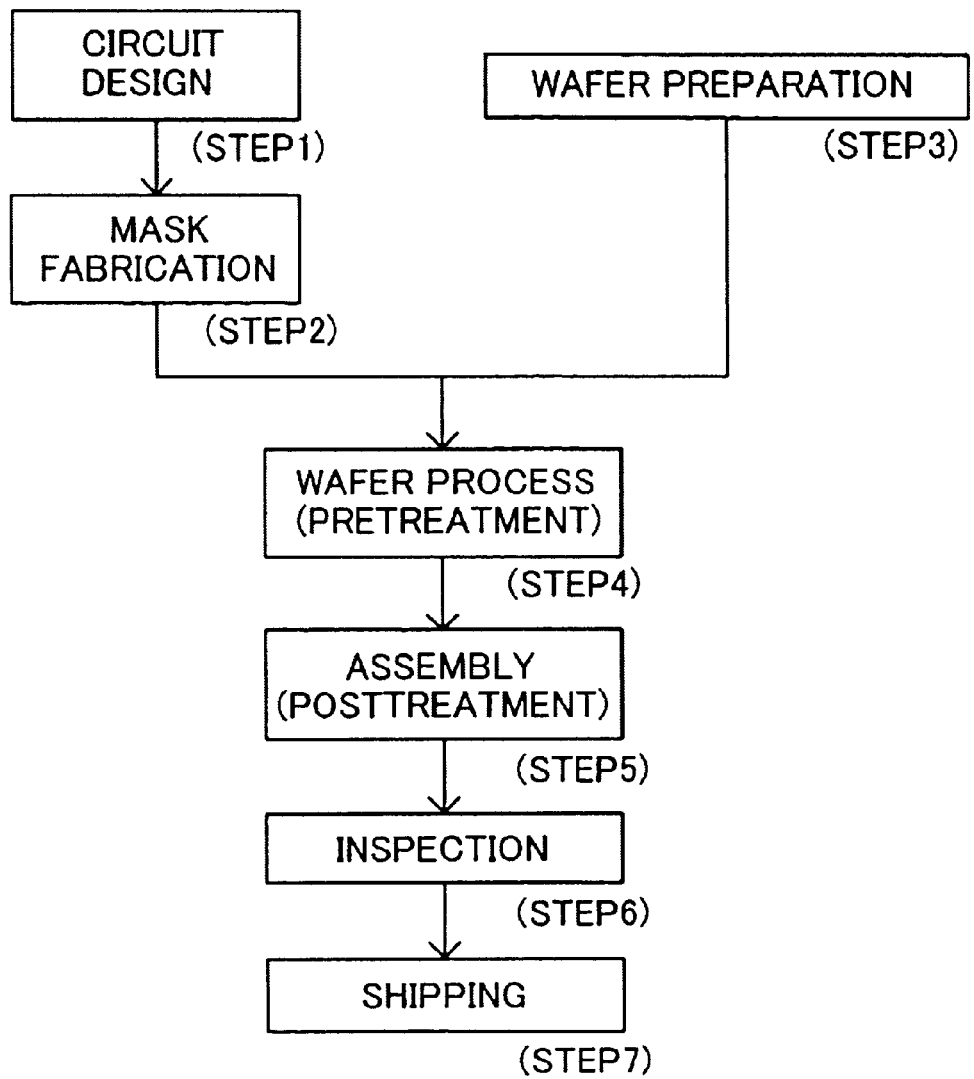
FIG. 9 is a flowchart for explaining how to fabricate devices (such as semiconductor chips such as ICs and LSIs, LCDs, CCDs, and the like).
Figure 10:
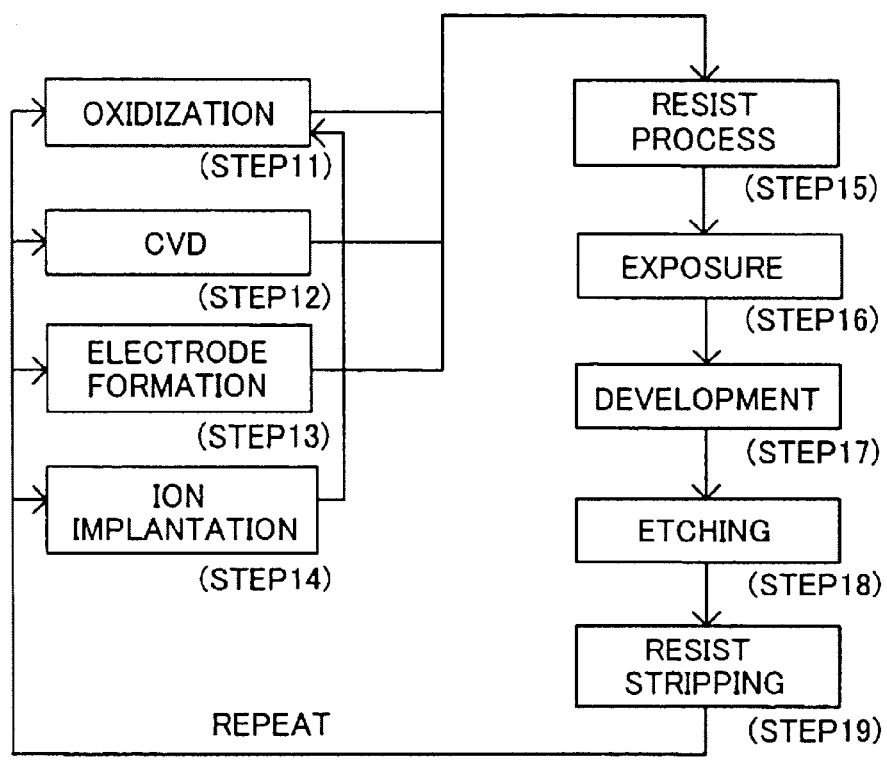
FIG. 10 is a flowchart for step 4 that is a wafer process shown in FIG. 9.

Referring to FIGS. 9 and 10, a description will now be given of an embodiment of a device fabrication method using the above mentioned exposure apparatus 200. FIG. 9 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 10 is a detailed flowchart of the wafer process in Step 9. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. This device fabrication method may manufacture higher quality devices than conventional. In this manner, the device fabrication method that uses the exposure apparatus 200 and resultant devices serve as other aspects of the present invention.

Further, the present invention is not limited to these preferred embodiments, and various variations and modifications may be made without departing from the scope of the present invention. For example, the present invention is applicable a catoptric projection optical system for non-EUV ultraviolet light with a wavelength of 200 nm or less, such as ArF excimer laser and $F_2$ excimer laser, as well as to an exposure apparatus that scans and exposes a large screen, or that exposes without scanning.

Thus, the present invention may provide a projection optical system and exposure apparatus applicable to the EUV lithography, which may achieve a six-mirror system with high NA, reduce not only the maximum effective diameter of mirrors but also the span of the optical system, and realize good imaging performance.

What is claimed is:

1. A six-mirror catoptric projection optical system for projecting a reduced size of a pattern on an object plane onto an image plane, said projection optical system consisting of first, second, third, fourth, fifth and sixth mirrors from the object plane along an optical path, wherein said third and fourth mirrors are located between said fifth mirror and sixth mirror, and wherein said catoptric projection optical system forms an intermediate image along the optical path from said third mirror to the fifth mirror.

2. A six-mirror catoptric projection optical system according to claim 1, wherein a principal ray of light from a center of the pattern to a center of the image plane does not intersect on an optical path from the pattern to the image plane.

3. A six-mirror catoptric projection optical system according to claim 1, wherein said third mirror from the object plane along the optical path has a maximum effective diameter.

4. A six-mirror catoptric projection optical system according to claim 1, wherein all of the mirrors in the catoptric projection optical system are aspheric mirrors having a multilayer film for reflecting EUV light.

5. A six-mirror catoptric projection optical system according to claim 1, wherein the catoptric projection optical system makes a side of the object plane non-telecentric.

6. A six-mirror catoptric projection optical system according to claim 5, wherein light emitted from the object plane is incident upon the first mirror from the object plane along the optical path at an incident angle from 50° to 10°.

7. A six-mirror catoptric projection optical system according to claim 1, wherein an exposure area at a side of the image plane has a slit width of 0.8 mm or greater.

8. A six-mirror catoptric projection optical system according to claim 1, wherein said first mirror is a concave mirror, said third mirror is a concave mirror, said fourth mirror is a convex mirror, said fifth mirror is a convex mirror, and said sixth mirror is a concave mirror.

9. A six-mirror catoptric projection optical system according to claim 1, wherein at least one of said first to sixth mirrors is an aspheric mirror, and has a numerical aperture of 0.2 or greater at an image surface side, and wherein an effective diameter of each of said six mirrors is not greater than 550 mm.

10. A six-mirror catoptric projection optical system according to claim 9, wherein all of said first to sixth mirrors are aspheric mirrors, and have a numerical aperture of 0.2 or greater at an image surface side, wherein an effective diameter of each of said six mirrors is not greater than 500 mm.

11. A six-mirror catoptric projection optical system according to claim 9, wherein a principal ray of light from a center of the pattern to a center of the image plane has an incident angle of 25° or smaller upon each of said first to sixth mirrors.

12. An exposure apparatus comprising:

a six-mirror catoptric projection optical system for project a reduced size of a pattern on an object plane onto an image plane, said projection optical system consisting of first, second, third, fourth, fifth and sixth mirrors from the object1 plane along an optical path, wherein said third and fourth mirrors are located between said fifth mirror and sixth mirror, and wherein said catoptric projection optical system forms an intermediate image along the optical path from said third mirror to the fifth mirror;

a mask stage for holding a mask that forms a pattern, and for positioning the pattern at the object plane;

a wafer stage for holding an object to be exposed having a photosensitive layer and for positioning the photosensitive layer on the image plane; and a scanner mechanism for scanning the mask stage and the wafer stage synchronously when EUV light illuminates the mask.

13. A device fabricating method comprising the steps of:

exposing an object using an exposure apparatus according to claim 12; and developing the exposed object.

* * * * *

UNITED STATES PATENT AND TRADEMARK OFFICE
CERTIFICATE OF CORRECTION

PATENT NO. : 6,975,385 B2
DATED : December 13, 2005
INVENTOR(S) : Yumiko Ohsaki, Toshihiro Sunaga and Koshi Hatakeyama It is certified that error appears in the above-identified patent and that said Letters Patent is hereby corrected as shown below:

Column 2,
Line 6, delete "a:" and replace it with -- at --;

Column 3,
Line 52, delete "50°"" and replace it with -- 5° --;

Column 4,
Line 20, delete "thee" and replace it with -- the --;
Line 30, delete "arid" and replace it with -- and --;
Line 32, delete "or" and replace it with -- of --;
Line 33, add the following paragraph:
-- A catoptric projection optical system of another aspect according to the present invention for projecting a reduced size of a pattern on a reticle onto an image plane includes six mirrors for reflecting light, which include, in order from the reticle to the image plane, a concave first mirror (M1), a second mirror (M2), a concave third mirror (M3), a convex fourth mirror (M4), a convex fifth mirror (M5), and a concave six mirror (M6), wherein an intermediate image is formed between the third mirror (M3) and the fifth mirror (M5), and at least one of the six mirrors is an aspheric mirror, light incident from the object plane to the first mirror (M1) having an angle of 5° or greater and being non-telecentric, and a side of the image plane being maintained telecentric. --.

Column 4,
Line 36, delete "and" (second occurrence) and replace it with -- an --;

Column 5,
Line 1, after "is", insert -- a --;
Line 34, delete "art" and replace it with -- an --;
Line 42, delete "M1" and replace it with -- MI --;
Line 44, delete "thud" and replace it with -- third --;

Column 6,
Line 21, delete "50°"" and replace it with -- 5° --;
Line 24, delete "aide" and replace it with -- side --;

Column 10,
Line 19, delete "thus" and replace it with -- this --;
Line 33, after "¼" insert -- times --;

Column 11,
Line 21, delete "7.60" and replace it with -- 7.6° --;
Line 60, delete "50°"" and replace it with -- 5° --;

UNITED STATES PATENT AND TRADEMARK OFFICE
CERTIFICATE OF CORRECTION

PATENT NO. : 6,975,385 B2
DATED : December 13, 2005
INVENTOR(S) : Yumiko Ohsaki, Toshihiro Sunaga and Koshi Hatakeyama It is certified that error appears in the above-identified patent and that said Letters Patent is hereby corrected as shown below:

Column 12,
Line 43, delete "491 6" and replace it with -- 491.6 --;
Line 49, delete "21"" and replace it with -- 21° --;
Line 53, delete "7.01256°" and replace it with -- 7.1256° --;
Line 65, delete "50°" and replace it with -- 5° --;

Column 13,
Line 45, delete "it" and replace it with -- It --;

Column 14,
Line 31, delete "nms" and replace it with -- rms --;

Column 15,
Line 44, delete "images" and replace it with -- image --;

Column 16,
Line 13, delete "or" and replace it with -- of --;

Column 17,
Line 5, delete "or" and replace it with -- of --;
Line 36, delete "farmed" and replace it with -- formed --;

Column 19,
Line 37, delete "50°" and replace it with -- 5° --;

Column 20,
Line 25, delete "object1" and replace it with -- object --.

Signed and Sealed this

Twenty-fifth Day of April, 2006

JON W. DUDAS
*Director of the United States Patent and Trademark Office*